(12) United States Patent
Bao

(10) Patent No.: US 11,703,526 B2
(45) Date of Patent: Jul. 18, 2023

(54) POWER FAILURE DETECTION CIRCUIT

(71) Applicant: XTX Technology Inc., Guangdong (CN)

(72) Inventor: Toby Bao, Guangdong (CN)

(73) Assignee: XTX Technology Inc., Shenzhen (CN)

( * ) Notice: Subject to any disclaimer, the term of this patent is extended or adjusted under 35 U.S.C. 154(b) by 197 days.

(21) Appl. No.: 17/295,548

(22) PCT Filed: Nov. 11, 2020

(86) PCT No.: PCT/CN2020/128138
§ 371 (c)(1),
(2) Date: May 20, 2021

(87) PCT Pub. No.: WO2021/135661
PCT Pub. Date: Jul. 8, 2021

(65) Prior Publication Data
US 2022/0308098 A1   Sep. 29, 2022

(30) Foreign Application Priority Data

Dec. 30, 2019 (CN) .......................... 201911389778.5

(51) Int. Cl.
| | |
|---|---|
| *G01R 19/165* | (2006.01) |
| *G01R 31/52* | (2020.01) |
| *G01R 19/145* | (2006.01) |
| *G01R 31/40* | (2020.01) |

(52) U.S. Cl.
CPC ..... *G01R 19/16519* (2013.01); *G01R 19/145* (2013.01); *G01R 19/16552* (2013.01); *G01R 31/40* (2013.01); *G01R 31/52* (2020.01)

(58) Field of Classification Search
CPC ............ G01R 19/16519; G01R 19/145; G01R 19/16552; G01R 31/40; G01R 31/52; G01R 19/165
USPC ................................. 324/76.11, 207.16, 415
See application file for complete search history.

(56) References Cited

U.S. PATENT DOCUMENTS

| | | | | |
|---|---|---|---|---|
| 2005/0225924 A1* | 10/2005 | Sibrai | ................. | B60R 21/0173 361/247 |
| 2007/0194832 A1* | 8/2007 | Miske | ................. | H03K 17/102 327/427 |
| 2016/0157309 A1* | 6/2016 | Geng | ........................ | H02J 9/06 307/20 |
| 2022/0403824 A1* | 12/2022 | Reimer | ............... | H04L 63/0209 |
| 2022/0413064 A1* | 12/2022 | Larkin | ............... | G01R 31/2837 |
| 2023/0008445 A1* | 1/2023 | Choi | ................ | H01M 8/04679 |

* cited by examiner

*Primary Examiner* — Giovanni Astacio-Oquendo

(57) ABSTRACT

Disclosed is a power failure detection circuit, including a first PMOS FET (mp1), a second PMOS FET (mp2), a first NMOS FET (mn2), a second NMOS FET (mn3) and a reset transistor (mn1). The PN junction area of the drain electrode of the first PMOS FET (mp1) is greater than the PN junction area of the drain electrode of the first NMOS FET (mn2). The PN junction area of the drain electrode of the second NMOS FET (mn3) is greater than the PN junction area of the drain electrode of the second PMOS FET (mp2). The power failure detection circuit of the present invention is novel in design and high in practicability.

4 Claims, 1 Drawing Sheet

POWER FAILURE DETECTION CIRCUIT

TECHNICAL FIELD

The present invention relates to the technical field of power failure detection, and particularly relates to a power failure detection circuit.

BACKGROUND ART

A power failure detection circuit is widely used inside an integrated circuit to ensure the normal resetting of the integrated circuit. As shown in FIG. 1, FIG. 1 shows a circuit diagram of an existing power failure detection circuit. The power failure detection circuit uses a voltage division circuit consisting of a resistor (R1) and a resistor (R2), a comparator (CMP1) compares the sampling power voltage with the stable voltage source (vref) inside a chip, and when the sampling power voltage is less than the voltage source (vref), a reset signal is generated to reset digital and analog circuits of the chip. This power failure detection circuit has relatively large quiescent current and is not suitable for integrated circuits that require low power consumption.

SUMMARY OF THE INVENTION

Aiming at the above technical problems, the present invention provides a power failure detection circuit.

The technical solution provided by the present invention is as follows:

The present invention provides a power failure detection circuit, including a first Positive channel-Metal-Oxide-Semiconductor ("PMOS") Field Effect Transistor ("FET"), a second PMOS FET, a first Negative channel-Metal-Oxide-Semiconductor ("NMOS") Field Effect Transistor, a second NMOS FET and a reset transistor;

the source electrode of the first PMOS FET is connected with a power supply terminal, the gate electrode of the first PMOS FET is connected with the drain electrode of the second PMOS FET, and the drain electrode of the first PMOS FET is connected with the drain electrode of the first NMOS FET; the source electrode of the second PMOS FET is connected with the power supply terminal, the gate electrode of the second PMOS FET is connected with the drain electrode of the first PMOS FET, and the drain electrode of the second PMOS FET is connected with the drain electrode of the second NMOS FET; the gate electrode of the first NMOS FET is connected with the drain electrode of the second NMOS FET; the source electrode of the first NMOS FET is grounded; the gate electrode of the second NMOS FET is connected with the drain electrode of the first NMOS FET, and the source electrode of the second NMOS FET is grounded;

the PN junction area of the drain electrode of the first PMOS FET is greater than the PN junction area of the drain electrode of the first NMOS FET; the PN junction area of the drain electrode of the second NMOS FET is greater than the PN junction area of the drain electrode of the second PMOS FET; and the current electrode of the reset transistor is electrically connected with the drain electrode of the first PMOS FET to output a reset electrical signal.

In the above power failure detection circuit of the present invention, the reset transistor uses a third NMOS FET, the drain electrode of the third NMOS FET is electrically connected with the drain electrode of the first PMOS FET, and the source electrode of the third NMOS FET is grounded.

The above power failure detection circuit of the present invention also includes a first voltage level detection circuit electrically connected with the drain electrode of the first PMOS FET and configured to detect the level at the drain electrode of the first PMOS FET.

The above power failure detection circuit of the present invention also includes a second voltage level detection circuit electrically connected with the drain electrode of the second PMOS FET and configured to detect the level at the drain electrode of the second PMOS FET.

Different from a traditional power failure detection circuit, the power failure detection circuit of the present invention does not need to maintain the working current of a power sampling circuit and a comparator at all times, other power detection circuits with high power consumption are turned on only after a reset state is triggered, the power detection circuits with high power consumption are turned off after the power is started, thus consuming almost no current under normal working voltage and is suitable for application scenarios of integrated circuits with low power consumption. The power failure detection circuit of the present invention is novel in design and high in practicability.

BRIEF DESCRIPTION OF THE DRAWINGS

The present invention is further described below with reference to drawings and Embodiments. In the drawings.

DETAILED DESCRIPTION OF THE INVENTION

The technical problem to be solved by the present invention is: an existing power failure detection circuit usually uses a voltage division circuit consisting of a resistor R1 and a resistor R2 to compare the sampling power voltage with the stable voltage source (vref) inside a chip, and when the sampling power voltage is less than the voltage source (vref), a reset signal is generated to reset digital and analog circuits of the chip. This power failure detection circuit has relatively large quiescent current and is not suitable for integrated circuits that require low power consumption. In view of this technical problem, the technical idea proposed by the present invention is: a power failure detection circuit is constructed, the detection work of system resetting is realized through the characteristic of leakage current of multiple transistors, and there is almost no current consumed under normal working voltage.

In order to make the technical objectives, technical solution and technical effects of the present invention clearer to facilitate those skilled in the art to understand and implement the present invention, the present invention will be further described in detail below with reference to the drawings and specific embodiments.

Figure 1:
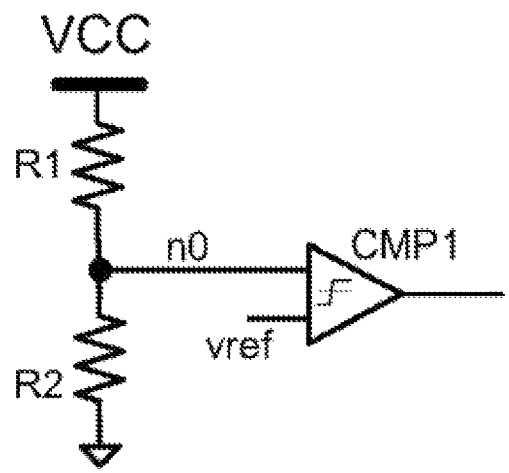
FIG. 1 shows a circuit diagram of an existing power failure detection circuit.
Figure 2:
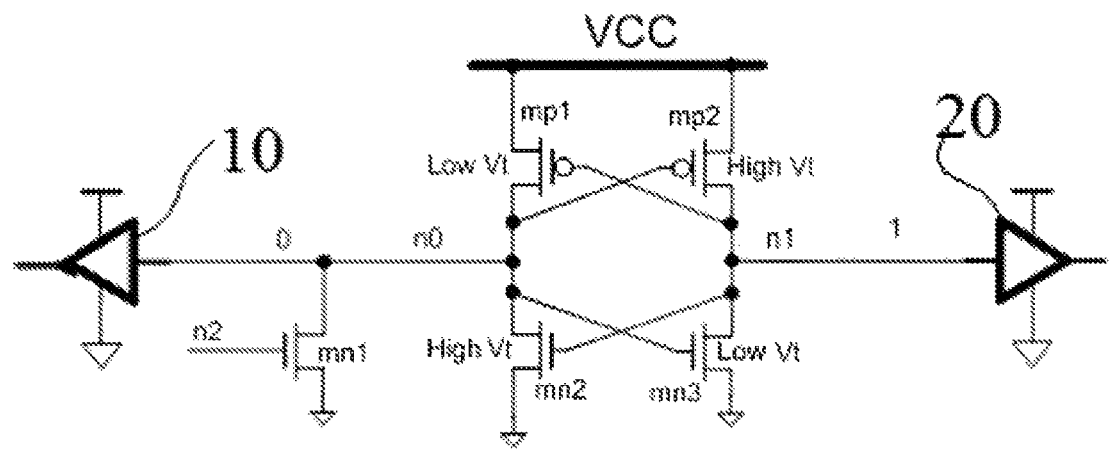
FIG. 2 shows a circuit diagram of a power failure detection circuit according to a preferred embodiment of the present invention.

As shown in FIG. 2, FIG. 2 shows a circuit diagram of a power failure detection circuit according to a preferred embodiment of the present invention. The power failure detection circuit includes a first PMOS FET (mp1), a second PMOS FET (mp2), a first NMOS FET (mn2), a second NMOS FET (mn3) and a reset transistor (mn1);

the source electrode of the first PMOS FET (mp1) is connected with a power supply terminal (VCC), the gate electrode of the first PMOS FET (mp1) is connected with the drain electrode of the second PMOS FET (mp2), and the drain electrode of the first PMOS FET (mp1) is connected with the drain electrode of the first NMOS FET (mn2); the source electrode of the second PMOS FET (mp2) is connected with the power supply terminal (VCC), the gate electrode of the second PMOS FET (mp2) is connected with the drain electrode of the first PMOS FET (mp1), and the drain electrode of the second PMOS FET (mp2) is connected with the drain electrode of the second NMOS FET (mn3); the gate electrode of the first NMOS FET (mn2) is connected with the drain electrode of the second NMOS FET (mn3); the source electrode of the first NMOS FET (mn2) is grounded;

the gate electrode of the second NMOS FET (mn3) is connected with the drain electrode of the first NMOS FET (mn2), and the source electrode of the second NMOS FET (mn3) is grounded;

the PN junction area of the drain electrode of the first PMOS FET (mp1) is greater than the PN junction area of the drain electrode of the first NMOS FET (mn2); the PN junction area of the drain electrode of the second NMOS FET (mn3) is greater than the PN junction area of the drain electrode of the second PMOS FET (mp2); and the current electrode of the reset transistor (mn1) is electrically connected with the drain electrode of the first PMOS FET (mp1) to output a reset electrical signal.

In the above technical solution, as shown in FIG. 2, after the reset transistor (mn1) outputs a reset electrical signal, a node (n0) is at a low level, and a node (n1) is at a high level; after the voltage of the power supply terminal (VCC) drops from the normal working voltage to be less than the threshold voltage of the second PMOS FET (mp2) and the first PMOS FET (mp1), the second PMOS FET (mp2) and the second NMOS FET (mn3) are turned off; the PN junction area of the drain electrode of the second NMOS FET (mn3) is much greater than the PN junction area of the drain electrode of the second PMOS FET (mp2), the PN junction area of the drain electrode of the first PMOS FET (mp1) is much greater than the PN junction area of the drain electrode of the first NMOS FET (mn2), and the magnitude of the leakage current of the transistor is directly proportional to the PN junction area, thereby causing that the level of the node (n0) is finally higher than the level of the node (n1); and when the voltage of the power supply terminal (VCC) rises again to be greater than the threshold voltage of the second PMOS FET (mp2), the first PMOS FET (mp1), the first NMOS FET (mn2) and the second NMOS FET (mn3), the node (n1) is maintained at a low level, the node (n0) is maintained at a high level, and the system is in a reset state. In other embodiments, at this moment, other power detection circuits can be used to detect the power voltage, so as to perform further power failure detection.

Specifically, in the present embodiment, the reset transistor (mn1) has a control electrode and two current electrodes. By adjusting the level of the control electrode of the reset transistor (mn1), the purpose of outputting a reset electrical signal through the current electrodes of the reset transistor (mn1) is realized. Preferably, the reset transistor (mn1) uses the third NMOS FET, the drain electrode of the third NMOS FET is electrically connected with the drain electrode of the first PMOS FET (mp1), and the source electrode of the third NMOS FET is grounded. By using the NMOS FETs, the power consumption of the system can be reduced. It can be understood that in other embodiments, the reset transistor (mn1) may also use a PMOS FET.

Further, the power failure detection circuit also includes a first voltage level detection circuit (10) electrically connected with the drain electrode of the first PMOS FET (mp1) and configured to detect the level at the drain electrode of the first PMOS FET (mp1). Thus, the level of the node (n0) can be detected by the first voltage level detection circuit (10).

The power failure detection circuit also includes a second voltage level detection circuit (20) electrically connected with the drain electrode of the second PMOS FET (mp2) and configured to detect the level at the drain electrode of the second PMOS FET (mp2). Thus, the level of the node (n1) can be detected by the second voltage level detection circuit (20).

The first voltage level detection circuit (10) and the second voltage level detection circuit (20) may be chips, transistors, complex circuits, and the like, may be different electrical elements, or may be the same integrated electrical element.

The power failure detection circuit provided by the present invention has no power-consuming circuits such as a sampling resistor and a comparator, so the power consumption is extremely low. The specific working principle of the power failure detection circuit is as follows:

1) the voltage of the gate electrode of the reset transistor (mn1), i.e., the voltage at the node (n2) is adjusted, the reset transistor (mn1) is turned on to realize system resetting, the node (n0) is at a low level, and the node (n1) is at a high level;

2) after the voltage of the power supply terminal (VCC) drops from the normal working voltage to be less than the threshold voltage of the second PMOS FET (mp2) and the first PMOS FET (mp1), the second PMOS FET (mp2) and the second NMOS FET (mn3) are turned off at the same time; the PN junction area of the drain electrode of the second NMOS FET (mn3) is much greater than the PN junction area of the drain electrode of the second PMOS FET (mp2), the PN junction area of the drain electrode of the first PMOS FET (mp1) is much greater than the PN junction area of the drain electrode of the first NMOS FET (mn2), and the magnitude of the leakage current of the transistor is directly proportional to the PN junction area, thereby causing that the level of the node (n0) is finally higher than the level of the node (n1); and 3) when the voltage of the power supply terminal (VCC) rises again to be greater than the threshold voltage of the second PMOS FET (mp2), the first PMOS FET (mp1), the first NMOS FET (mn2) and the second NMOS FET (mn3), the node (n1) is maintained at a low level, the node (n0) is maintained at a high level, and the system is in a reset state. At this moment, other power detection circuits with high power consumption can be turned on; after the power returns to the normal working level, the power detection circuits with high power consumption are turned off; and the node (n0) is pulled down to a low level again through the reset transistor (mn1), and the node (n1) will change to a high level accordingly, thus completing the system resetting process.

Different from a traditional power failure detection circuit, the power failure detection circuit of the present invention does not need to maintain the working current of the power sampling circuit and the comparator at all times, other power detection circuits with high power consumption are turned on only after a reset state is triggered, the power detection circuits with high power consumption are turned off after the power is started, and the power failure detection circuit of the present invention consumes almost no current under normal working voltage and is suitable for application scenarios of integrated circuits with low power consumption. The power failure detection circuit of the present invention is novel in design and high in practicability.

The embodiments of the present invention are described above with reference to the drawings. However, the present invention is not limited to the above specific embodiments. The above specific embodiments are only exemplary, but not restrictive. Under the teaching of the present invention, a person of ordinary skill in the art can make many forms without departing from the objectives of the present invention and the protection scope of the claims, and these forms all fall within the protection scope of the present invention.

What is claimed is:

1. A power failure detection circuit, comprising a first PMOS FET (mp1), a second PMOS PET (mp2), a first NMOS FET (mn2), a second NMOS PET (mn3) and a reset transistor (mn1), wherein the source electrode of the first PMOS FET (mp1) is connected with a power supply terminal (VCC), the gate electrode of the first PMOS FET (mp1) is connected with the drain electrode of the second PMOS FET (mp2), and the drain electrode of the first PMOS FET (mp1) is connected with the drain electrode of the first NMOS PET (mn2); the source electrode of the second PMOS FET (mp2) is connected with the power supply terminal (VCC), the gate electrode of the second PMOS FET (mp2) is connected with the drain electrode of the first PMOS FET (mp1), and the drain electrode of the second PMOS FET (mp2) is connected with the drain electrode of the second NMOS FET (mn3); the gate electrode of the first NMOS FET (mn2) is connected with the drain electrode of the second NMOS FET (mn3); the source electrode of the first NMOS FET (mn2) is grounded; the gate electrode of the second NMOS FET (mn3) is connected with the drain electrode of the first NMOS PET (mn2), and the source electrode of the second NMOS FET (mn3) is grounded;

the PN junction area of the drain electrode of the first PMOS PET (mp1) is greater than the PN junction area of the drain electrode of the first NMOS FET (mn2); the PN junction area of the drain electrode of the second NMOS FET (mn3) is greater than the PN junction area of the drain electrode of the second PMOS FET (mp2); and a current electrode of the reset transistor (mn1) is electrically connected with the drain electrode of the first PMOS FET (mp1) to output a reset electrical signal.

2. The power failure detection circuit according to claim 1, wherein the reset transistor (mn1) uses a third NMOS FET, the drain electrode of the third NMOS FET is electrically connected with the drain electrode of the first PMOS FET (mp1), and the source electrode of the third NMOS FET is grounded.

3. The power failure detection circuit according to claim 1, also comprising a first voltage level detection circuit (10) electrically connected with the drain electrode of the first PMOS PET (mp1) and configured to detect the level at the drain electrode of the first PMOS FET (mp1).

4. The power failure detection circuit according to claim 1, also comprising a second voltage level detection circuit (20) electrically connected with the drain electrode of the second PMOS FET (mp2) and configured to detect the level at the drain electrode of the second PMOS FET (mp2).

\* \* \* \* \*